US010229958B2

(12) United States Patent
Forrest et al.

(10) Patent No.: US 10,229,958 B2
(45) Date of Patent: *Mar. 12, 2019

(54) DEVICES COMBINING THIN FILM INORGANIC LEDS WITH ORGANIC LEDS AND FABRICATION THEREOF

(71) Applicant: THE REGENTS OF THE UNIVERSITY OF MICHIGAN, Ann Arbor, MI (US)

(72) Inventors: Stephen R. Forrest, Ann Arbor, MI (US); Kyusang Lee, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/112,960

(22) Filed: Aug. 27, 2018

(65) Prior Publication Data

US 2019/0013366 A1 Jan. 10, 2019

Related U.S. Application Data

(63) Continuation of application No. 15/039,978, filed as application No. PCT/US2014/067755 on Nov. 26, 2014, now Pat. No. 10,062,738.

(Continued)

(51) Int. Cl.
*H01L 27/32* (2006.01)
*H01L 51/00* (2006.01)
(Continued)

(52) U.S. Cl.
CPC ........ *H01L 27/3225* (2013.01); *H01L 27/322* (2013.01); *H01L 27/3209* (2013.01);
(Continued)

(58) Field of Classification Search
None
See application file for complete search history.

(56) References Cited

U.S. PATENT DOCUMENTS

| 4,769,292 A | 9/1988 | Tang |
|---|---|---|
| 5,247,190 A | 9/1993 | Friend |

(Continued)

FOREIGN PATENT DOCUMENTS

| WO | 2008057394 A1 | 5/2008 |
|---|---|---|
| WO | 2010011390 A2 | 1/2010 |
| WO | 2013064800 A1 | 5/2013 |

OTHER PUBLICATIONS

Baldo, et al., "Very high-efficiency green organic light-emitting devices based on electrophosphorescence", Applied Physics Letters, Jul. 5, 1999, 4 pages, vol. 75, No. 1, American Institute of Physics, Melville, NY, USA.

(Continued)

*Primary Examiner* — Lex H Malsawma
(74) *Attorney, Agent, or Firm* — Morris & Kamlay LLP

(57) ABSTRACT

Devices including organic and inorganic LEDs are provided. Techniques for fabricating the devices include fabricating an inorganic LED on a parent substrate and transferring the LED to a host substrate via a non-destructive ELO process. Scaling techniques are also provided, in which an elastomeric substrate is deformed to achieve a desired display size.

16 Claims, 18 Drawing Sheets

Related U.S. Application Data

(60) Provisional application No. 61/909,390, filed on Nov. 27, 2013.

(51) Int. Cl.
*H01L 51/56* (2006.01)
*H01L 33/00* (2010.01)
*G09G 3/3208* (2016.01)
*G09G 3/32* (2016.01)

(52) U.S. Cl.
CPC ...... *H01L 27/3211* (2013.01); *H01L 27/3216* (2013.01); *H01L 51/0001* (2013.01); *H01L 51/56* (2013.01); *G09G 3/32* (2013.01); *G09G 3/3208* (2013.01); *G09G 2300/0452* (2013.01); *H01L 33/0079* (2013.01); *H01L 51/0097* (2013.01); *H01L 2227/326* (2013.01)

(56) References Cited

U.S. PATENT DOCUMENTS

| | | |
|---|---|---|
| 5,703,436 A | 12/1997 | Forrest |
| 5,707,745 A | 1/1998 | Forrest |
| 5,834,893 A | 11/1998 | Bulovic |
| 5,844,363 A | 12/1998 | Gu |
| 5,893,760 A * | 4/1999 | Mikata .................. C30B 31/14 438/758 |
| 6,013,982 A | 1/2000 | Thompson |
| 6,087,196 A | 7/2000 | Sturm |
| 6,091,195 A | 7/2000 | Forrest |
| 6,097,147 A | 8/2000 | Baldo |
| 6,156,623 A * | 12/2000 | Hendrix .................. C23C 14/50 257/E21.214 |
| 6,294,398 B1 | 9/2001 | Kim |
| 6,303,238 B1 | 10/2001 | Thompson |
| 6,337,102 B1 | 1/2002 | Forrest |
| 6,468,819 B1 | 10/2002 | Kim |
| 7,279,704 B2 | 10/2007 | Walters |
| 7,431,968 B1 | 10/2008 | Shtein |
| 7,968,146 B2 | 6/2011 | Wagner |
| 10,062,738 B2 * | 8/2018 | Forrest .................. H01L 51/56 |
| 2003/0184990 A1 | 10/2003 | Lin |
| 2003/0230980 A1 | 12/2003 | Forrest |
| 2004/0174116 A1 | 9/2004 | Lu |
| 2004/0188671 A1 | 9/2004 | Tan |
| 2006/0169989 A1 | 8/2006 | Bhattacharya |
| 2007/0018915 A1 | 1/2007 | Tang |
| 2007/0057263 A1 | 3/2007 | Karen |
| 2009/0262545 A1 | 10/2009 | Amelung |
| 2010/0123141 A1 | 5/2010 | Cok |
| 2013/0235095 A1 | 9/2013 | Cok |

OTHER PUBLICATIONS

International Search Report and Written Opinion, dated Apr. 6, 2015 in corresponding International Application No. PCT/US2014/067755.

Baldo et al. Highly efficient phosphorescent emission from organic electroluminescent devices, Nature, vol. 395, pp. 151-154, 1998.

* cited by examiner

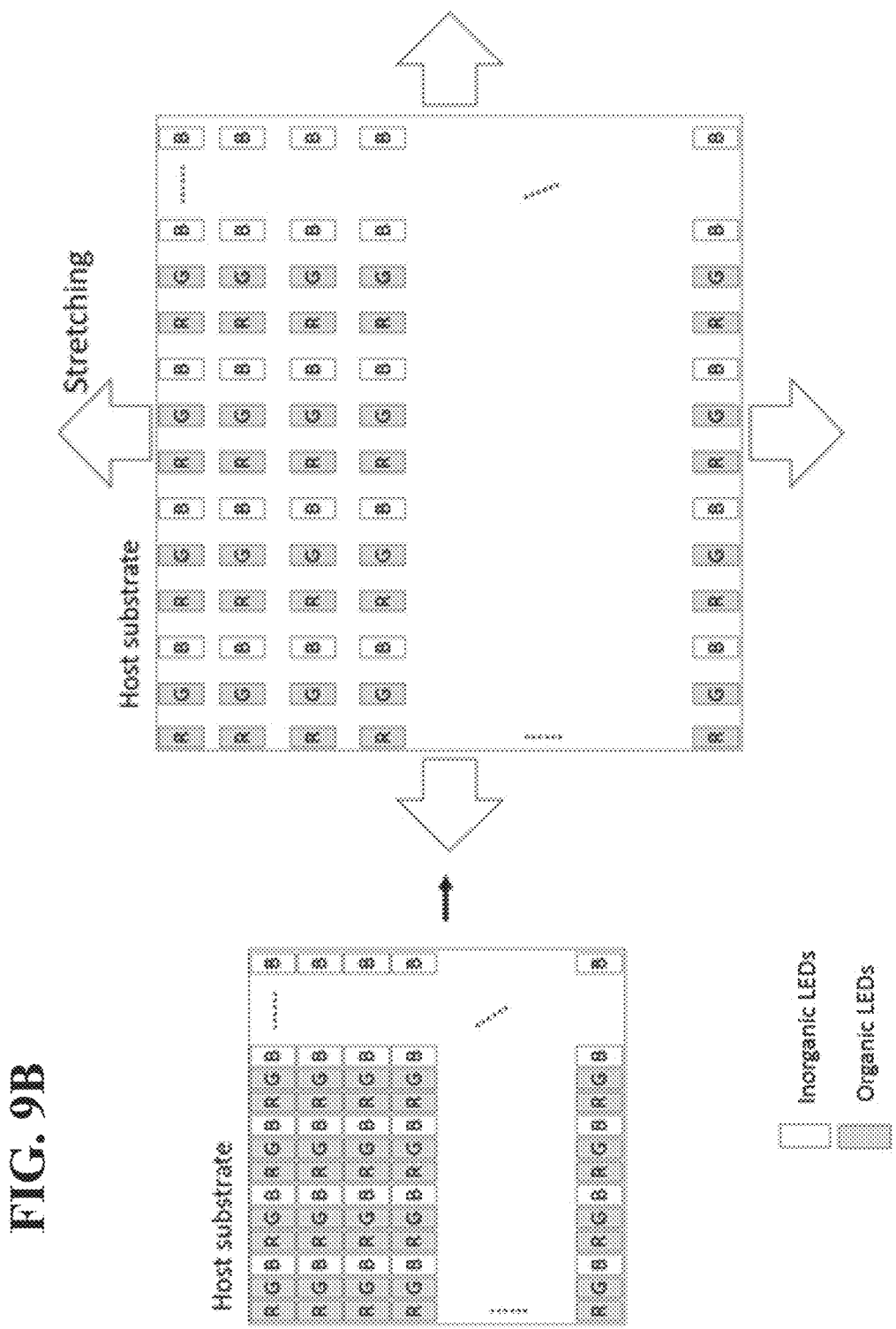

DEVICES COMBINING THIN FILM INORGANIC LEDS WITH ORGANIC LEDS AND FABRICATION THEREOF

CROSS-REFERENCE TO RELATED APPLICATIONS

This application claims priority to U.S. Provisional Patent Application Ser. No. 61/909,390, filed Nov. 27, 2013, and is a continuation of U.S. patent application Ser. No. 15/039,978, filed May 27, 2016, which is a National Stage entry of International Application No. PCT/US2014/067755, filed Nov. 26, 2014, the entire contents of each of which is incorporated herein by reference.

STATEMENT REGARDING GOVERNMENT RIGHTS

The claimed invention was made under Contract No. DE-SC0001013, awarded by the U.S. Department of Energy (DOE), Office of Basic Energy Sciences, as part of the Center for Energy Nanoscience, Energy Frontier Research Center. The government may have certain rights in the invention.

PARTIES TO A JOINT RESEARCH AGREEMENT

The claimed invention was made by, on behalf of, and/or in connection with one or more of the following parties to a joint university corporation research agreement: Regents of the University of Michigan, Princeton University, University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to LED displays having thin-film inorganic LEDs and OLEDs, and devices including the same and fabrication techniques thereof.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted Ir(ppy)$_3$, which has the following structure:

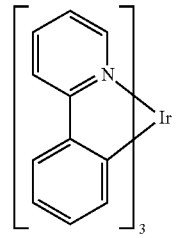

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY OF THE INVENTION

According to an embodiment, a device is provided that includes an inorganic first light-emitting diode (LED) disposed over a substrate; an organic second LED (OLED) disposed over the substrate; and a third LED disposed over the substrate and adjacent to the first LED or the second LED, which may be inorganic or organic. Each of the first, second, and third LEDs may be individually addressable as a sub-pixel within the device. The inorganic first LED may be configured to emit blue light.

A full-color display comprising a plurality of pixels, each of the pixels comprising a plurality of sub-pixels, wherein at least a first portion of sub-pixels in the display comprise OLEDs and at least a second portion of sub-pixels in the display comprise inorganic LEDs.

In an embodiment, a device as disclosed herein may be fabricated by depositing an epitaxial protective layer over an epitaxial substrate, such as a GaN, sapphire, GaAs, Si, InP, and/or GaSb wafer; depositing an epitaxial sacrificial layer over the epitaxial protective layer; depositing a plurality of emissive stacks over the epitaxial sacrificial layer; cold-welding the emissive stack to a flexible substrate; separating the epitaxial protective layer from the emissive stack; applying one or more layers to each stack of the plurality of emissive stacks to form a first plurality of LEDs; transferring a first portion of the first plurality of LEDs to a first host substrate; and fabricating a second plurality of LEDs on the first host substrate. In an embodiment, the first plurality of LEDs are configured to emit blue light, and the second plurality of LEDs comprises OLEDs configured to emit red light. In another embodiment, the first plurality of LEDs are configured to emit blue light, and the second plurality of LEDs comprises OLEDs configured to emit green light. Alternatively or in addition, color altering layers may be fabricated over one or more of the LEDs. The epitaxial protective layer may be separated from the emissive stack via an epitaxial lift-off (ELO) process as disclosed herein, which may be non-destructive of underlying layers. A second portion of the first plurality of LEDs may be transferred to a separate second host substrate, and a third plurality of organic or inorganic LEDs may be fabricated on the second host substrate. Additional layers and devices may be fabricated on the host substrate(s), including additional LEDs, OLEDs, color altering layers, and the like.

In an embodiment, an elastomeric host substrate may be deformed, such as to increase the distance between adjacent LEDs on the host substrate. It may be deformed, for example, by stretching the host substrate, such as by applying pressure to the first host substrate with a curved surface such as a rigid roll, a pin, a vacuum mold, and a spherical surface, and/or by placing the first host substrate in a vacuum mold and applying the vacuum mold to the first host substrate. The host substrate may be a host substrate as previously described, such as one on which LEDs have been transferred from a parent substrate.

According to another embodiment, a first device comprising a first organic light emitting device is also provided. The first organic light emitting device can include organic and inorganic light emitting diodes. The first device can be a consumer product, an organic light-emitting device, a lighting panel, or any other device as disclosed herein.

BRIEF DESCRIPTION OF THE DRAWINGS

FIG. 4A shows atomic force microscope images of a GaAs parent wafer substrate surface showing the RMS surface roughness after each step. The growth starts with sub-nanometer surface roughness. However, immediately following ELO by etching the sacrificial layer, the roughness increases by an order of magnitude. Plasma cleaning reduces surface roughness by removing particulates while minor physical damage is incurred by the underlying GaAs protection layer. Wet chemical cleaning is used to remove the remaining InGaP protection layer, recovering the same surface morphology as the original wafer. FIG. 4B shows a three-dimensional laser microscope image of the surface immediately following ELO (left), and after plasma cleaning (right). FIG. 4C shows the thin film surface following ELO (left), and after plasma cleaning (right).

FIGS. 9A and 9B show examples of scaling an organic and/or inorganic LED-based display by expanding a substrate as disclosed herein.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
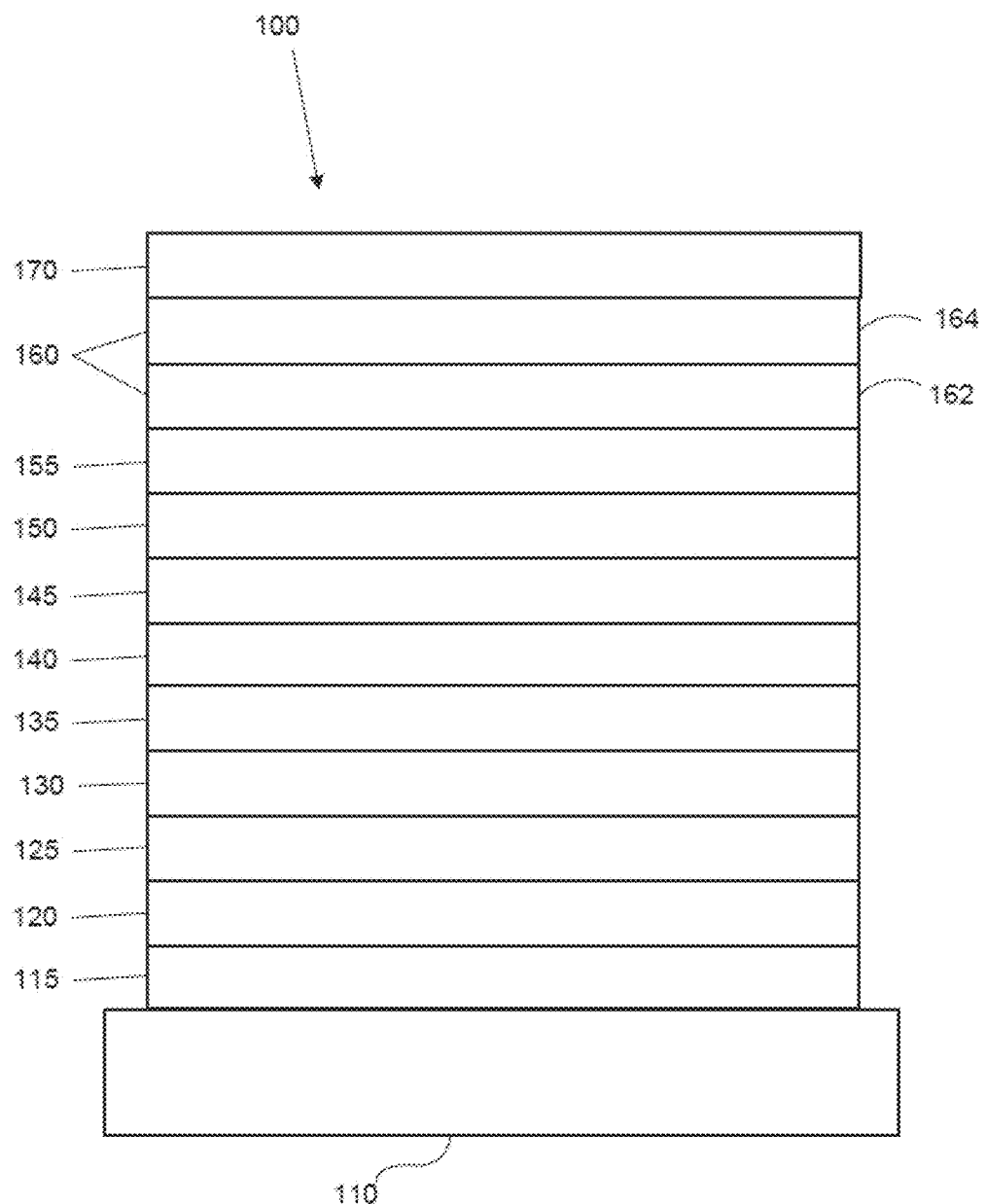
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
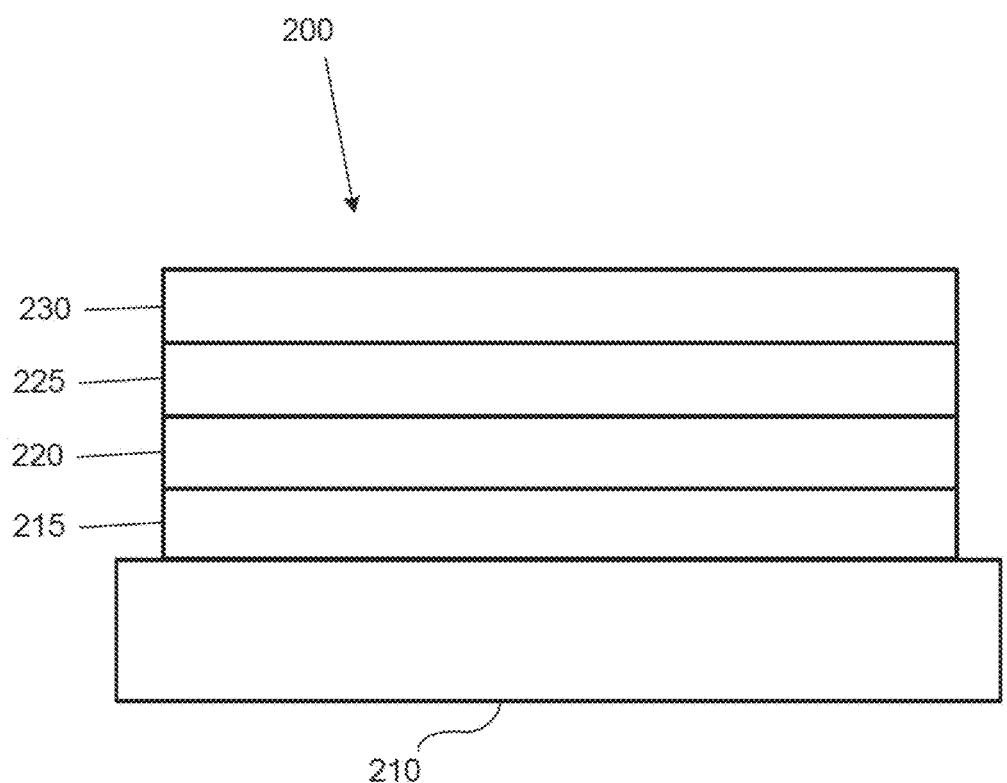
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, cell phones, tablets, phablets, personal digital assistants (PDAs), laptop computers, digital cameras, camcorders, viewfinders, micro-displays, 3-D displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 C to 30 C, and more preferably at room temperature (20-25 C), but could be used outside this temperature range, for example, from −40 C to +80 C.

In contrast to OLEDs, many applications of inorganic LEDs for display technology are mostly limited to large-area and low-resolution applications, such as outdoor LED screens, due to high production cost and difficulty of fabrication, even though LEDs may have superior properties than OLEDs in terms of lifetime, brightness and efficiency.

For example, compared to elemental semiconductors such as Si and Ge, compound semiconductors often have superior material properties for optoelectronic devices, including high carrier mobilities, direct and indirect band-gap tuning, ability to form heterojunctions that confine optical fields and charge, etc. However, compound semiconductor active device regions are epitaxially grown on costly wafers, limiting their viability for use in the production of large area devices such as displays. Epitaxial lift-off (ELO) may be used to reduce costs of such techniques, including fabrication of GaAs/AlGaAs devices, by enabling the separation of single-crystal active epitaxial layers from fragile and bulky substrates using hydrofluoric acid to selectively remove an AlAs sacrificial layer grown between the substrate and the device layers. The ELO process is also advantageous in that it yields a flexible and lightweight thin film.

Unfortunately, the promise of wafer reuse suggested by ELO processes has not been realized, due to damage and debris on the parent wafer surface resulting from the removal of the sacrificial layer. The most common method for preparing the surface for subsequent growth has been through post lift-off chemo-mechanical polishing, which reduces wafer thickness and ultimately inflicts additional damage, limiting reuse to only a very few growth and cleaning cycles.

Embodiments disclosed herein provide non-destructive epitaxial lift-off (ND-ELO) techniques to address these shortcomings. In addition, embodiments disclosed herein allow for fabrication of three-color LED pixel arrays that include both inorganic LEDs and OLEDs, or inorganic blue LEDs with down conversion layers. Embodiments disclosed herein also provide techniques to scale up organic/inorganic hybrid arrangements as disclosed herein, using a stretchable substrate. LEDs fabricated by this method may be relatively lightweight, semitransparent, stretchable, and/or conformal.

The conventional ELO process typically is considered to be advantageous because it yields a flexible and lightweight thin film. Unfortunately, the removal of the sacrificial layer results in damage and leaves debris on the parent wafer surface. The most common method for preparing that surface for subsequent growth conventionally is by post lift-off chemo-mechanical polishing that reduces wafer thickness and ultimately inflicts additional damage, limiting reuse to only a very few growth and cleaning cycles. In contrast, embodiments disclosed herein may use the HF chemistry-based ELO process, and employ surface protecting layers that can be removed using chemically selective etchants. These protection layers may include alternating lattice-matched materials, such as arsenide-based and phosphide-based materials, that enable recovery of the wafer surface for regrowth on the original wafer without any observable degradation in surface quality or device performance. The resulting surface may be ready for subsequent epitaxial growth without further treatment or cleaning.

More specifically, embodiments disclosed herein may use a two-step surface cleaning procedure of non-destructive epitaxial lift off (ND-ELO), which eliminates an interface between materials with different group-V species, whose addition requires temperature changes during growth that increases both the growth time and amount of material used. Such a scheme of lattice-matched protection layers combined with a non-destructive surface cleaning is adaptable to III-V based LEDs without material composition limitations or the need for damage-inducing wafer polishing commonly used in conventional ELO processes.

Figure 3:
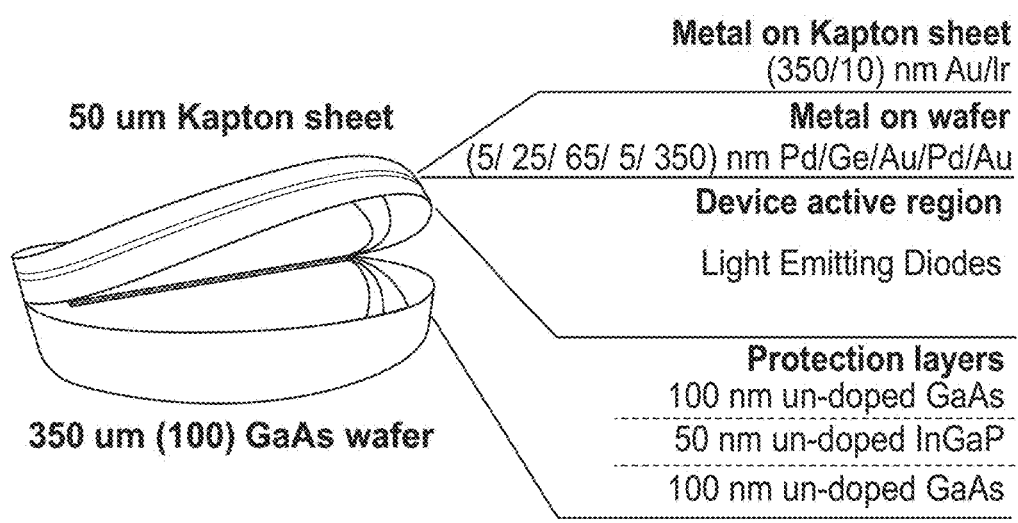
FIG. 3 shows an example of a non-destructive ELO process and generalized epitaxial structure as disclosed herein.

FIG. 3 shows an example of a non-destructive ELO process and generalized epitaxial structure as disclosed herein. The epitaxial structure includes sequential growth of protection, sacrificial and active device layers. For example, InGaP (50 nm) and GaAs (100 nm) protection and buffer layers may be grown by gas source molecular beam epitaxy (GSMBE) on a 2 inch diameter (100) GaAs parent wafer. The specific example shown is illustrative, but an equivalent process may be used for growth of other layers and by other common techniques. For example, other wafer types and compositions may be used, including GaN, sapphire, GaAs, Si, InP, GaSb, and combinations thereof. A sacrificial release layer, such as the AlAs release layer shown, then may be grown onto the protection layer stack.

One or more active device layers then may be deposited in inverted order on the stack, such that after bonding to a secondary plastic substrate, devices can be fabricated in their conventional orientation. This technique eliminates the need for a second transfer step that is often employed in conventional ELO device processing. For LEDs, the rear surface mirror may improve external quantum efficiency by allowing photons to be reflected back to the emitting surface instead of being absorbed in the wafer bulk.

To eliminate the need for adhesives and an intermediate handle transfer, the epitaxial surface may be attached directly to the final flexible substrate following layer growth using a thermally-assisted cold-weld bond. To do so, pressure may be applied across the two surfaces to be bonded. The surfaces may be pre-coated with layers of a similar noble metal to make such a bond.

As a specific example as shown in FIG. 3, to prepare for cold-weld bonding a 10 nm thick Ir adhesion layer may be sputtered on a Kapton® sheet. The Ir layer provides tensile strain to the substrate that significantly reduces the wafer and substrate separation time more than 90% and 35% compared to a conventional ELO process without the Ir layer and a surface tension-assisted ELO process, respectively. Next, Pd (5 nm)/Ge (25 nm)/Au (65 nm)/Pd (5 nm) layers are deposited onto the substrate using e-beam evaporation to form an ohmic contact with the $5\times10^{18}$ cm$^{-3}$ Si-doped n-type GaAs layer. A 350 nm thick Au layer is then simultaneously deposited on both sample surfaces to complete the cold-welding bonding surfaces.

Cold-weld bonding may be performed under vacuum ($\sim10^{-5}$ Torr) with an applied force of 4 MPa at a stage temperature of 175° C. The process allows for approximately a 92% reduction in bonding pressure compared to conventional room temperature cold-welding under ambient conditions. The Au layer also conveniently acts as a back contact and mirror while being undamaged by exposure to HF used in the ELO process. Further, it is insensitive to oxidation that can increase the pressure needed to effect the cold-weld bond, and lifted-off layers can be attached to flexible secondary handles using adhesives such as thermal releasing tape, wax, or glue.

Once the GaAs substrate is bonded to the host substrate, the active device region is lifted-off from the parent wafer by immersion in HF for approximately 5 hours. Then, the separated epitaxial films may be fabricated into LEDs. Although ELO is an effective means to separate the substrate and active region to create a thin film device, as previously described it often results in roughening of the parent wafer surface, as well as the accumulation of contaminants, notably $As_2O_3$. This surface roughening is shown in the atomic force microscope (AFM) image of FIG. 4A. This morphological degradation significantly and negatively impacts device performance in subsequently regrown layers.

To recover the original surface quality, embodiments disclosed herein use a non-destructive two-step cleaning procedure. Continuing the example described above, the surface is pre-cleaned by an inductively coupled plasma using 50 SCCM of $C_4F_8$, a chemical etch gas to remove the oxides, mixed with 50 SCCM of Ar+ for 10 s under 10 mTorr of base pressure at a substrate RF bias power of 110 W and a transformer coupled plasma RF power of 500 W.

Figure 4A:
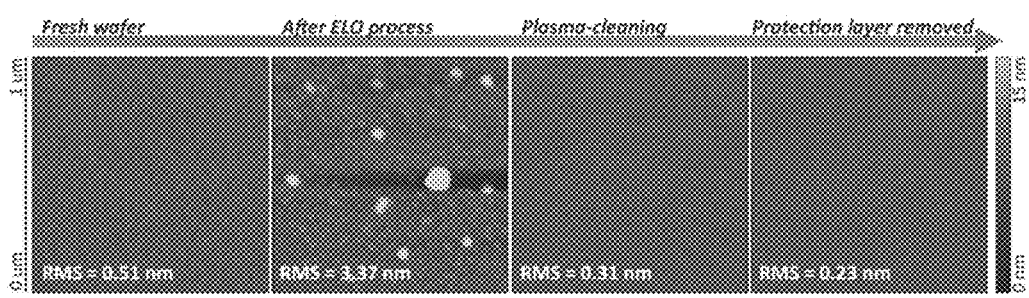
FIGS. 4A-4C show a comparison of wafer surface morphology before and after ELO.
Figure 4B:
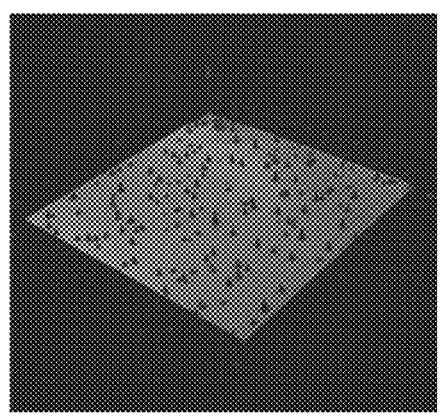
Figure 4B:
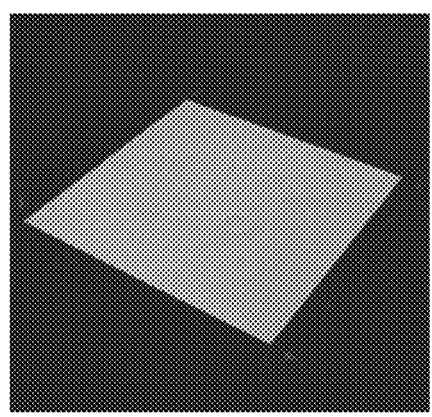
Figure 4C:
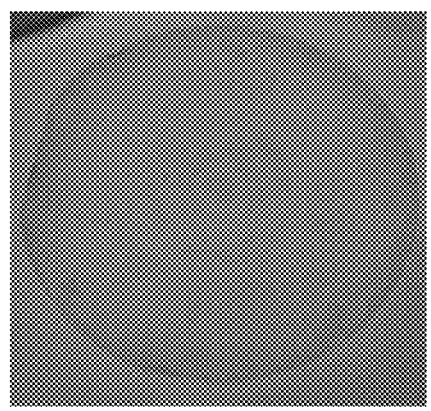
Figure 4C:
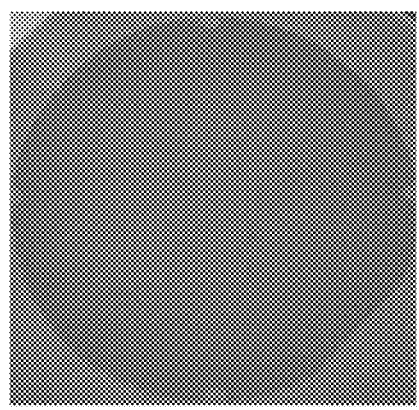

FIG. 4B shows three-dimensional laser microscopy images of the wafer surface before and after plasma cleaning, respectively. The image indicates that most of the contamination is apparently removed during the cleaning process, leaving a roughened surface. This cleaning procedure can be applied to the lifted-off film as well as the substrate, which are similarly contaminated following the ELO process as shown in FIG. 4C. While they eliminate the ELO process residuals, they also physically/chemically damage the protection layer surface. Hence, the InGaP and GaAs previously described protection layers are grown on both the epi-side and the substrate-side (each in reverse order to the other starting with GaAs on the substrate). The roughened top GaAs protection layer is then removed using a phosphoric acid-based etchant ($H_3PO_4:H_2O_2:H_2O$ (3:1:25)) until the etching stops at the InGaP layer. Next, the InGaP layer is removed through etching in diluted HCl acid ($HCl:H_2O$ (1:1)), which provides complete etching selectivity with the GaAs growth buffer layer. The dilute HCl etch is well-known for preparing epi-ready surfaces through the removal of native oxides, allowing this last step of surface cleaning to provide a high quality regrowth interface. The root mean square (RMS) surface roughness after each step is shown in FIG. 4A, confirming the recovery of the original surface morphology after cleaning.

Since it is difficult to grow blue LEDs on a GaAs wafer, to complete a fabrication of thin-film, three color LED pixels displays using a technique as described with respect to FIGS. 3-4, in embodiments disclosed herein, blue OLEDs may be used together with ND-ELO processed red and/or green inorganic LEDs. Alternatively or in addition, hybrid organic/inorganic LEDs can be fabricated from blue LEDs based on, for example, GaN, InGaN or ZnSe, using laser lift-off (LLO) or spalling from a SiC, Si or sapphire substrate, combined with red/green OLEDs or down conversion layers.

As will be readily understood by one of skill in the art, to achieve a hybrid LED/OLED display structure, it is desirable to integrate each pixel, and thus each sub-pixel, with a backplane circuit to operate the display. As disclosed herein, inorganic LEDs may be fabricated using an ND-ELO process as previously described, before being transferred to a final host substrate and integrated with one or more OLEDs and a backplane circuit or other arrangement to control the individual devices.

To transfer LEDs, a mask, such as an Au metal mask, may be used to define a device area. The mask may be used for cold weld bonding between LED and the transistor array. The LEDs and a backplane circuit can be aligned for bonding using transparent substrates, an IR camera, a bonding aligner, or any other suitable alignment technique. Although examples shown and described herein refer to an LED active area, it will be understood that multiple layers, areas, materials, and the like may be fabricated on a parent substrate such as a wafer as disclosed herein. Such an arrangement may be referred to as an emissive stack. In general, an emissive stack may be used to fabricate a functional device through the addition of one or more electrodes, though in some configurations an emissive stack may include one or more of the electrodes used to fabricate a light-emitting device as disclosed herein.

After cold-weld bonding, the LEDs can be separated from their wafers via the ND-ELO process as previously described. After the ND-ELO process, the parent wafer can be reused by removing the protection layers. To complete a three-color pixel, blue OLEDs may be fabricated on the same host substrate. Alternatively or in addition, blue inorganic LEDs may be transferred to the host substrate by LLO or spalling process as previously described, and integrated with red and green OLEDs as shown and described in further detail with respect to FIGS. 5A-5B. Alternatively or in addition, three blue inorganic LEDs can be transferred to the host substrate before depositing red and green organic or inorganic down conversion layers to create a three color LED display, as shown and described in further detail with respect to FIG. 6. To address differences in efficiency between inorganic LEDs and OLEDs, the pixel size of some or all of the individual devices may be scaled up or down, as shown and described in further detail with respect to FIG. 7.

Active layers of each of the inorganic LEDs can be lifted-off from parent wafers and transferred to a temporary substrate for patterning, before being transferred or printed onto backplane circuits either one by one or batch by batch before integration with OLEDs.

Using techniques as disclosed herein, LEDs can be either top-emitting type devices on arbitrary substrates, or bottom-emitting type devices on transparent substrates.

Figure 5A:
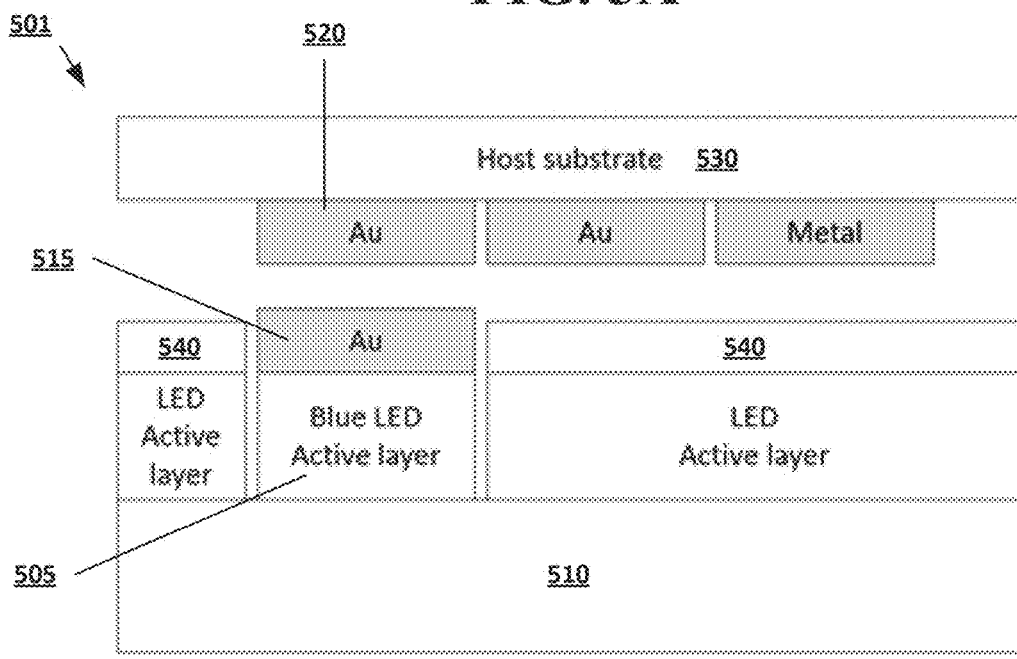
FIG. 5A shows an example of fabricating and transferring an inorganic LED from a parent substrate to a host substrate and OLED patterning on the same substrate as disclosed herein.
Figure 5A:
Figure 5A:
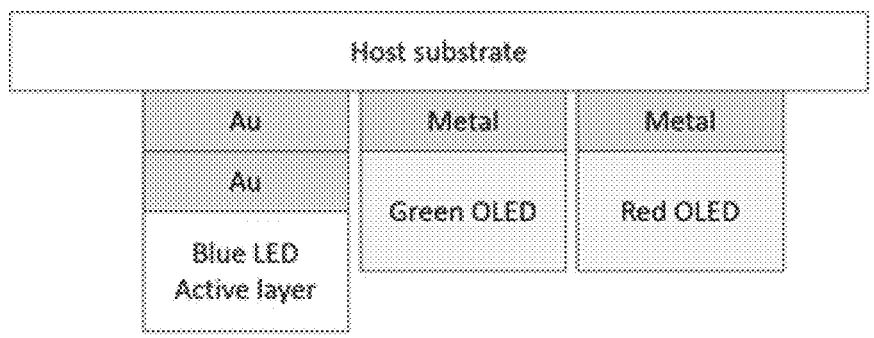

Referring now to FIG. 5A, a simplified fabrication flow is shown for a process of fabricating and transferring a blue inorganic LED sub-pixel from a parent (initial) substrate to a host substrate, and for red and/or green OLED patterning on the same substrate to achieve a three color, inorganic/organic hybrid LED display. At 510, one or more LED active layers 505 may be disposed on an initial substrate 510, such as a Si wafer, a sapphire wafer, or the like, as previously described. A metal layer 515, such as Au or other suitable metal, may be disposed over the LED active area. The metal layer may then be cold-welded to a metal layer 520 on the host substrate 530 as previously described, to transfer the LED active layers to the host substrate. Any suitable cold-welding technique and materials may be used.

As shown in FIG. 5A, additional LED active layers may be resident on the parent substrate 510, which are not intended to be transferred to the host substrate 530. Such areas may be covered by a protective layer or layers 540, such as via masked deposition onto the active layers while on the parent substrate. Thus, these active areas will not be transferred to the host substrate during the cold-welding process. As described in further detail with respect to FIGS. 5B-5D, such masking and partial transfer may be useful, for example, to allow a single sheet of inorganic LED active layers to be used to fabricate multiple devices on multiple host substrates.

Figure 5B:
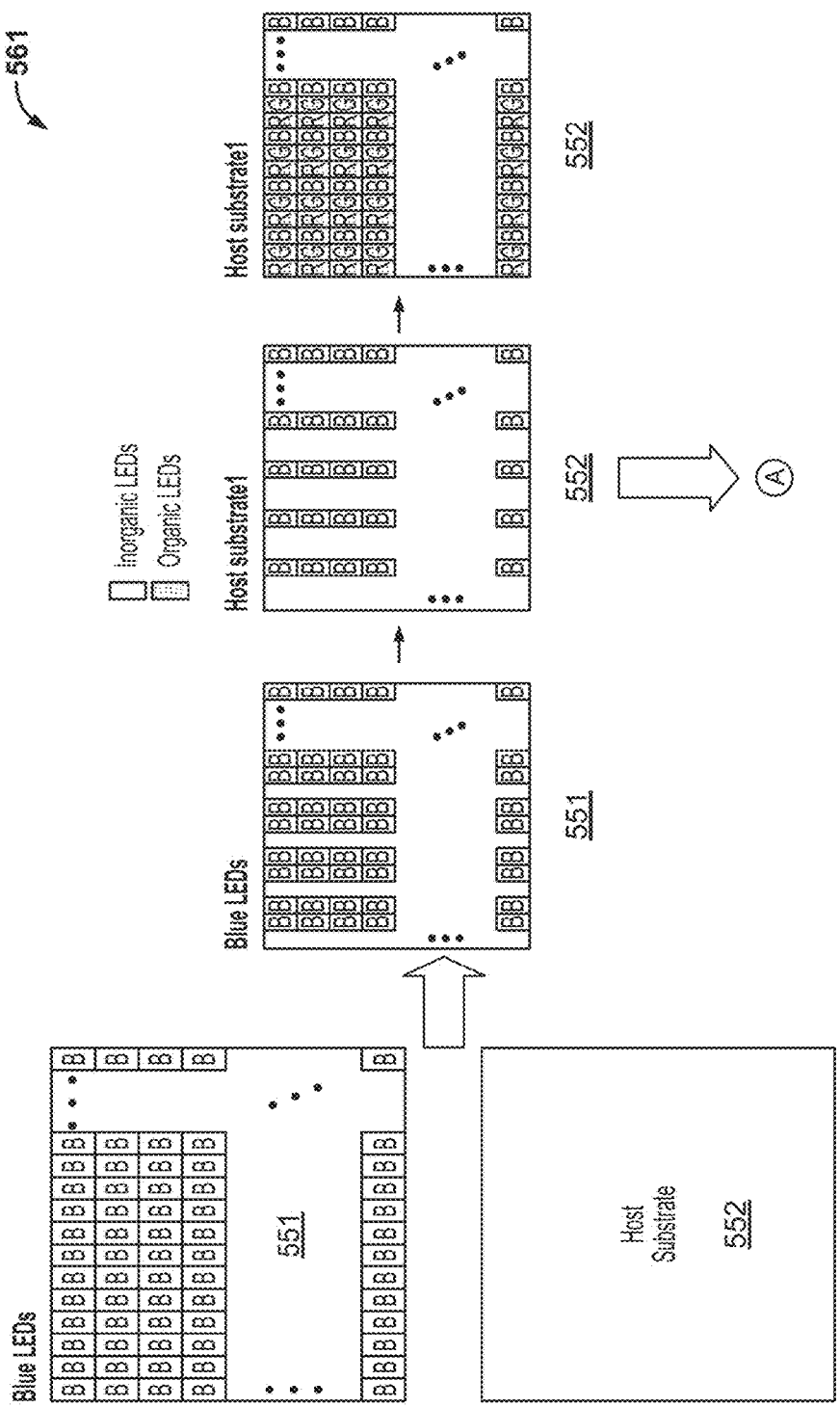
FIG. 5B shows multiple inorganic LEDs disposed on a parent substrate, and a host substrate prior to transfer as disclosed herein.
Figure 5C:
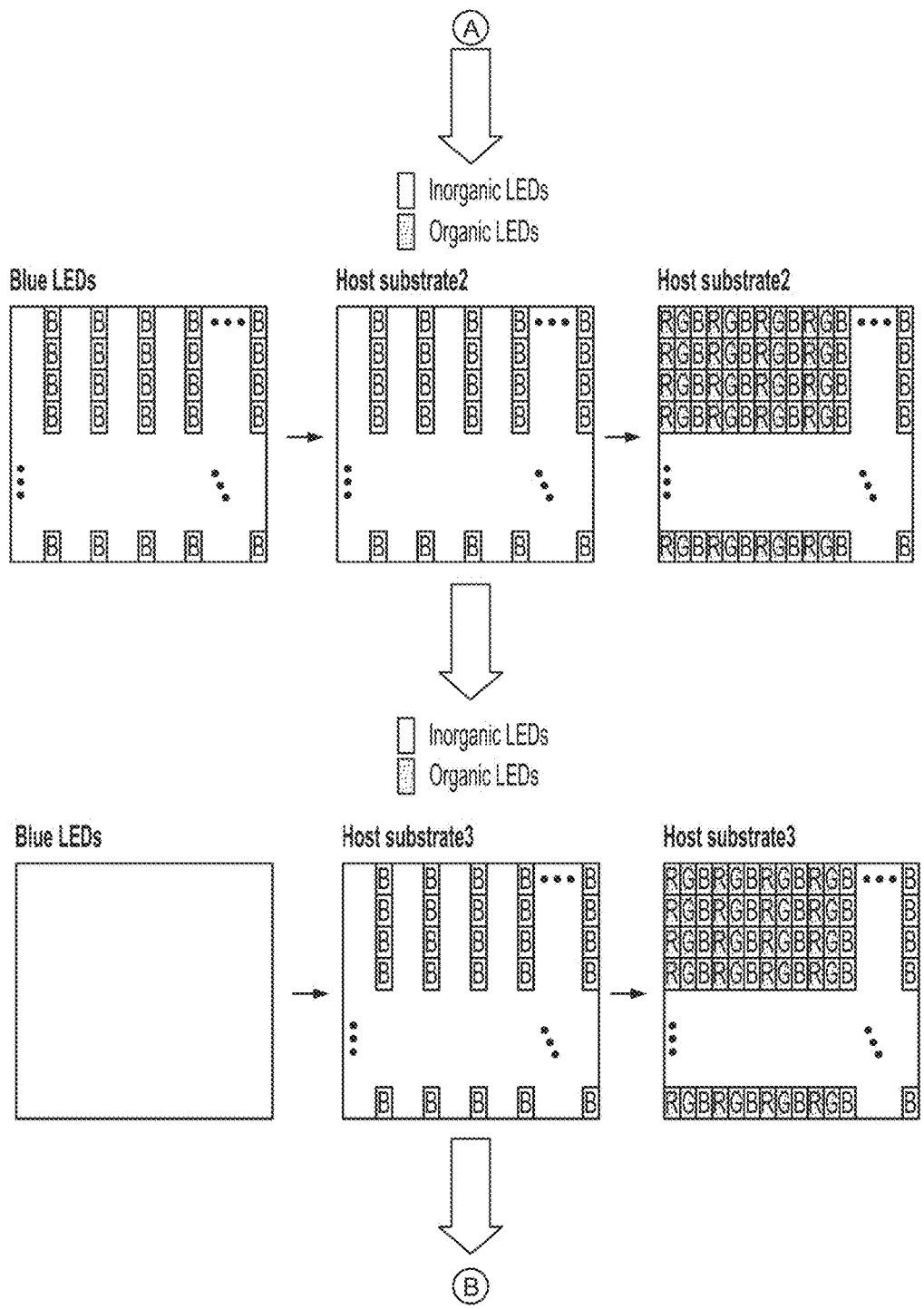
FIGS. 5C and 5D show extensions of the process shown in FIG. 5B as disclosed herein, in which additional LED active areas are transferred to additional host substrates.
Figure 5D:
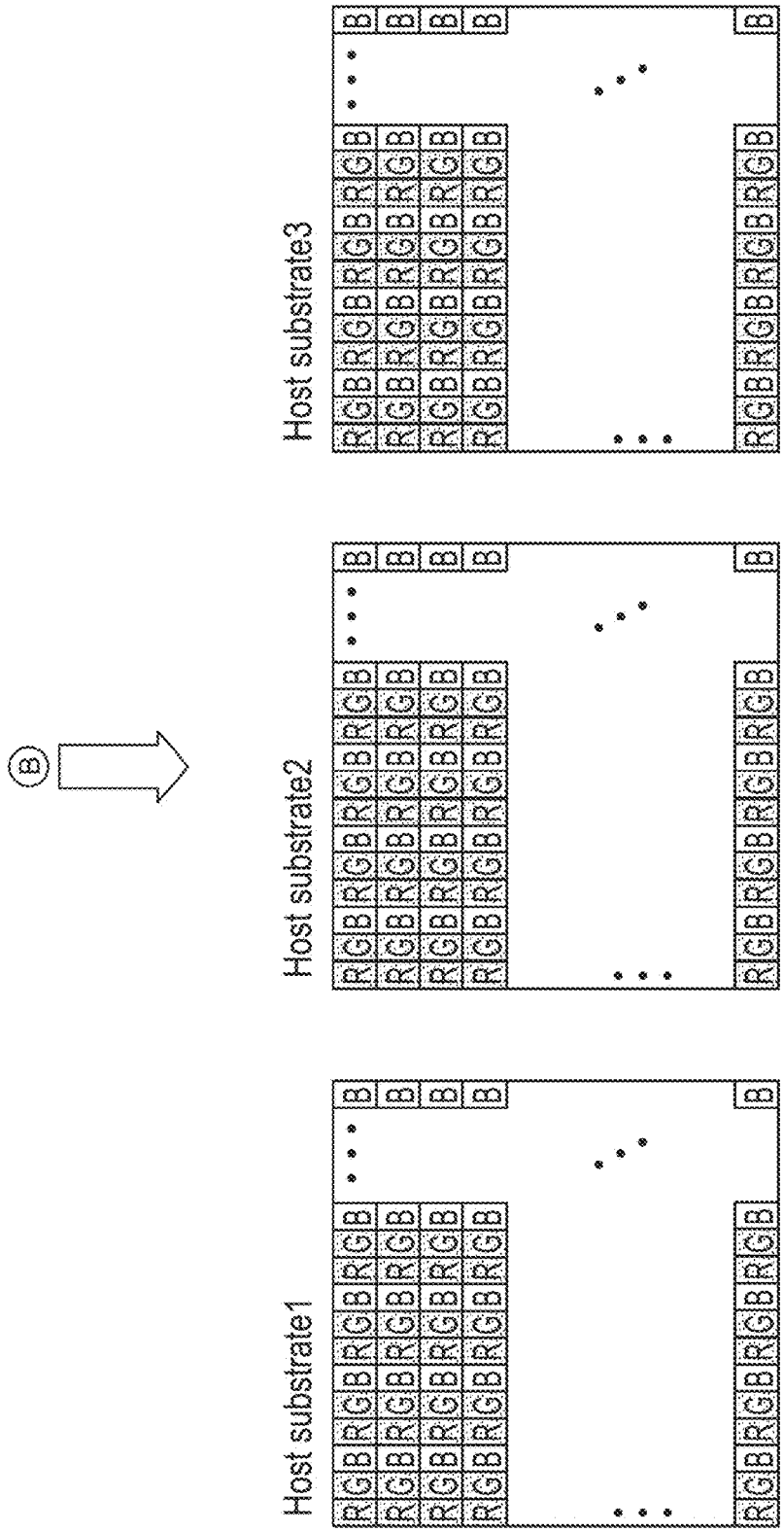

FIGS. 5B-5D show a simplified fabrication flow for fabrication of multiple displays via aligned transfer and OLED patterning as previously described. FIG. 5B shows multiple inorganic LEDs disposed on a parent substrate 551. The LEDs may be deposited on the parent substrate using any suitable technique as previously described. Initially, a host substrate 552 may have no LEDs disposed on a surface, though the surface may have been prepared for the transfer of LEDs from the parent substrate 551, such as by fabrication of one or more metal layers as previously described and, for example, as shown in FIG. 5A. As shown, a portion, substantially all, or all of the parent substrate may be coated with one or more active LED layers. FIGS. 5B-5D show the active LED layers as blue layers, but any color or combination of colors may be used.

At 561, the active LED layers may be transferred from the parent substrate to a host substrate, such as via a cold-welding technique as previously described. For example, as shown in FIG. 5B, the active LED layers on the parent substrate 551 may be masked into rows or columns of device active areas, such that every third column of device active areas is coated with a metal for transfer via cold-welding to the host substrate. Thus, after the transfer, the host substrate 551 includes rows of transferred LED active areas, separated by regions in which no material has been transferred. As shown, the empty areas of the host substrate may be twice the area of the total area of the transferred active areas. Such a configuration may be useful, for example, to allow for additional devices to be deposited in the empty areas. However, any desired arrangement of LED active areas may be transferred to achieve any desired pixel or sub-pixel arrangement on the host substrate. In the example shown in FIG. 5B, additional LEDs, which may be OLEDs, may be fabricated in the regions in which active areas are not transferred from the parent substrate. For example, where blue LED active areas are transferred, red and green LEDs and/or OLEDs may be fabricated in the regions of the host substrate in which active areas are not transferred from the parent substrate.

FIGS. 5C and 5D show extensions of the process shown in FIG. 5B, in which additional LED active areas are transferred to additional host substrates. That is, FIGS. 5C and 5D show the same process as shown in FIG. 5B, repeated for additional host substrates, using the remaining LED active areas from the parent substrate. As shown, the parent substrate may be repeatedly masked, such that the same structure and arrangement of LEDs and OLEDs is achieved on three separate host substrates.

It will be understood that the column structure shown in FIGS. 5B-5D is illustrative, and additional arrangements of active areas may be transferred from a parent substrate to a host substrate using the same transfer processes as disclosed herein. Alternatively or in addition, additional layers may be fabricated on active areas transferred to the host substrate or substrates, after the transfer is complete.

Figure 6:
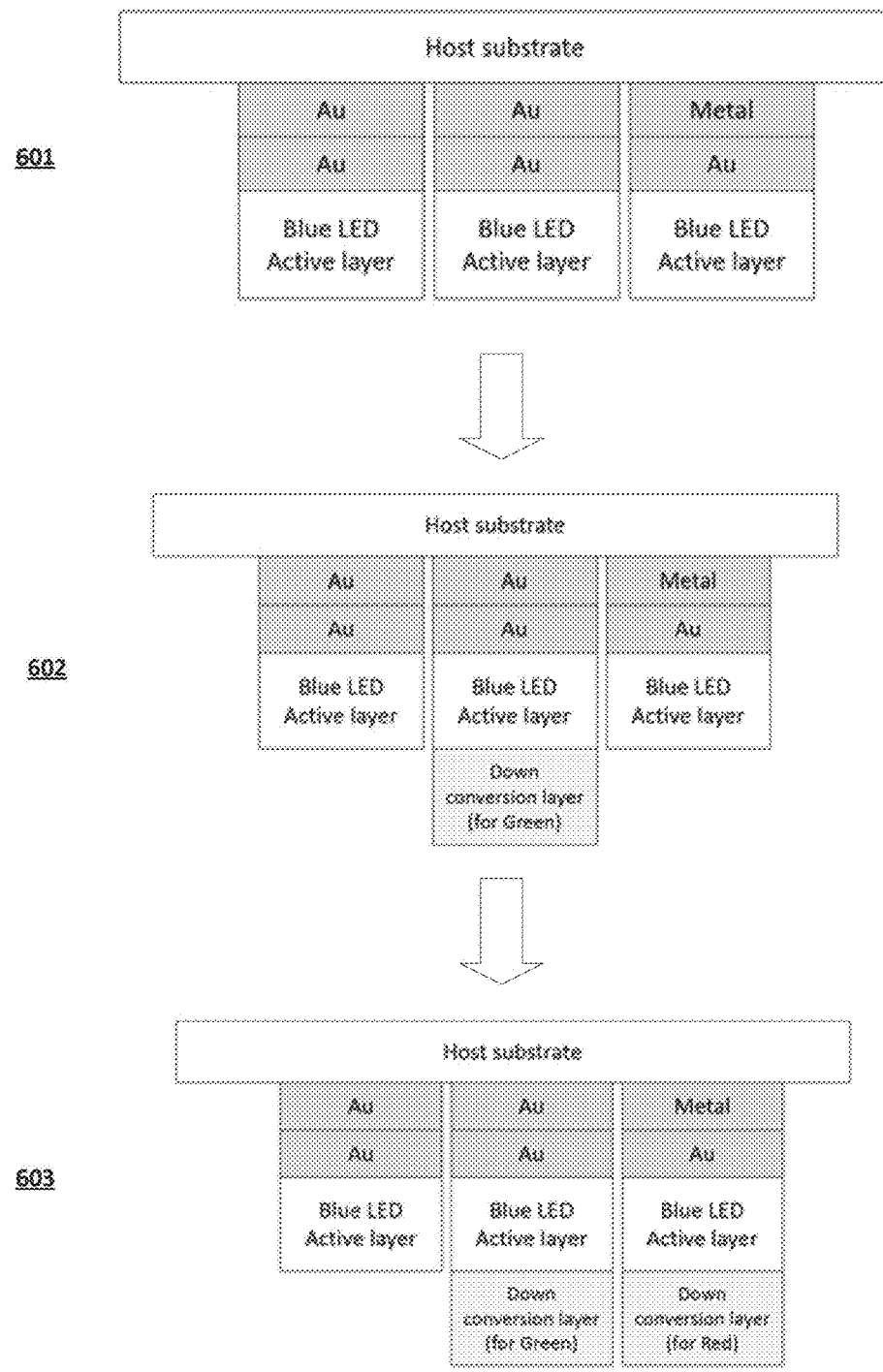
FIG. 6 shows an example process in which inorganic LED active areas are transferred from a parent substrate to a host substrate and organic down conversion layer are patterned over the LED active areas as disclosed herein.

For example, FIG. 6 shows an illustrative, simplified fabrication flow for three blue, inorganic LED pixels transferred from a parent substrate to a host substrate and red/green down conversion layer patterning to achieve a three color, inorganic/organic LED display. At 601, several LED active areas may be transferred to a host substrate as previously described. FIG. 6 shows three active areas for illustration purposes, but it will be understood that the same arrangement and process as shown in FIG. 6 may be performed for any number of active areas, through appropriate masking, transfer, and additional masking after transfer to the host substrate. At 602, a color altering layer may be fabricated over a portion of the transferred LED active areas. For example, where the LED active areas are blue-emitting, a green down conversion layer may be fabricated over a portion of the LED active areas to form green sub-pixels. Similarly, at 603, a color altering layer may be fabricated over a different portion of the transferred LED active areas, such as where a red down conversion layer is fabricated over additional blue LED active areas to form red sub-pixels.

Figure 7:
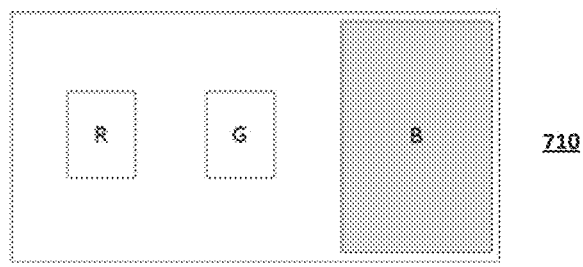
FIG. 7 shows an example host substrate having varied spacing and/or size of different active areas as disclosed herein.
Figure 7:
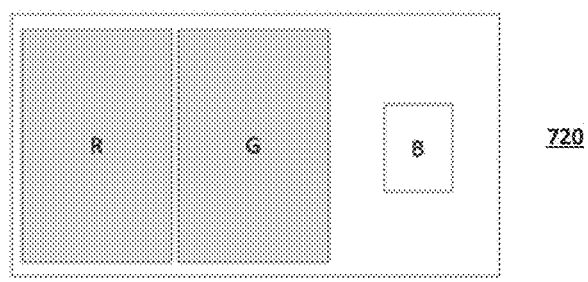

FIGS. 5-6 show examples in which LED and OLED active areas, and thus sub-pixels, are arranged in uniform spacing and immediately adjacent to one another. In some embodiments, it may be preferred to use different spacing for different portions of transferred LED active areas, and/or for the spacing to be non-uniform between transferred LED active areas and regions on a host substrate in which no active areas are transferred. For example, FIG. 7 shows an illustrative example in which the spacing and size of different active areas varies, for example, to accommodate differences in efficiency between inorganic and organic LEDs, and/or between different colors of LEDs and OLED. For example, as shown in FIG. 7, it may be advantageous for an arrangement in which inorganic red and green LEDs are used, to include additional spacing between adjacent active areas, such as to allow for a blue OLED that is larger than red and green inorganic LEDs within each pixel. That is, when red and green inorganic LEDs are transferred from a parent substrate to a host substrate as previously described, they may be transferred with additional space between them to allow for larger blue OLEDs to be deposited as shown at 710, while still maintaining a uniform spacing overall across the pixels or other logical groupings of active areas within the resulting device. As another example, inorganic blue LEDs may be transferred as shown at 720, while allowing space for larger red and green OLEDs to be fabricated. More generally, any desired spacing and arrangement of LED active areas may be transferred to a host substrate, to allow for any desired additional inorganic LEDs and/or OLEDs, of any desired relative size, placement, and configuration, to be fabricated on the host substrate.

Figure 8:
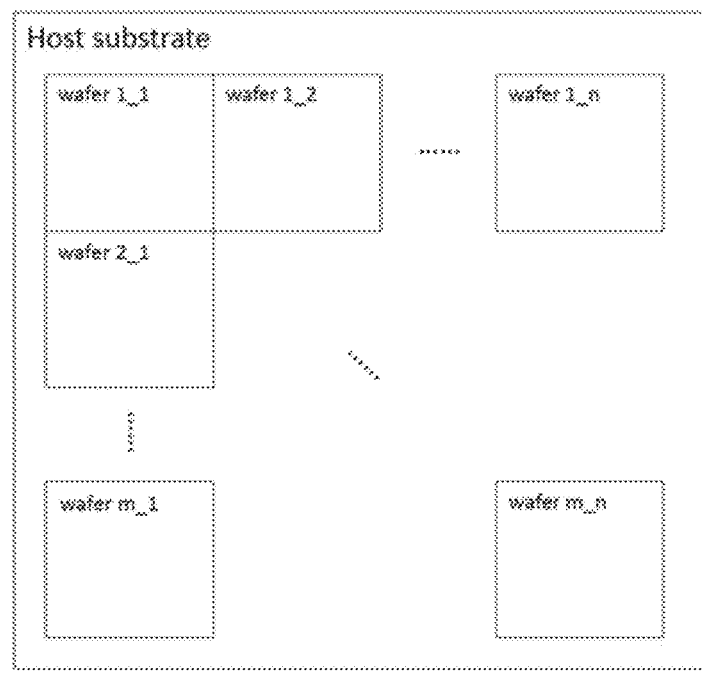
FIG. 8 shows an example a large area display with multiple wafers be used to create a single display panel as disclosed herein.

In some embodiments, it may be desirable to re-scale an arrangement of LEDs to achieve a desired size, such as for a specific display size. For example, due to conventional limitations of III-V wafer size, a single batch of LEDs often cannot be larger than a 6 inch wafer. For mobile displays, a single wafer can be used to cover the display panel. For a large area display, multiple wafers can be used to complete a single display panel, as shown in FIG. 8. As a specific example, LED active areas from multiple wafers may be transferred to a single larger host substrate, following the processes previously described. The additional fabrication steps, such as deposition of one or more OLEDs and/or color altering layers, then may be performed across the entire host substrate including transferred areas from multiple parent wafers. For example, a large mask may be used to fabricate OLEDs and/or color altering layers across the LED active areas from multiple wafers.

Alternatively or in addition, in some embodiments a variable density array of LEDs may be transferred to an elastomer before being stretched or shrunk to meet size requirements. Since the LED active region is relatively very thin, LEDs may be transferred to a flexible plastic substrate and used as light weight and flexible displays.

Figure 9A:
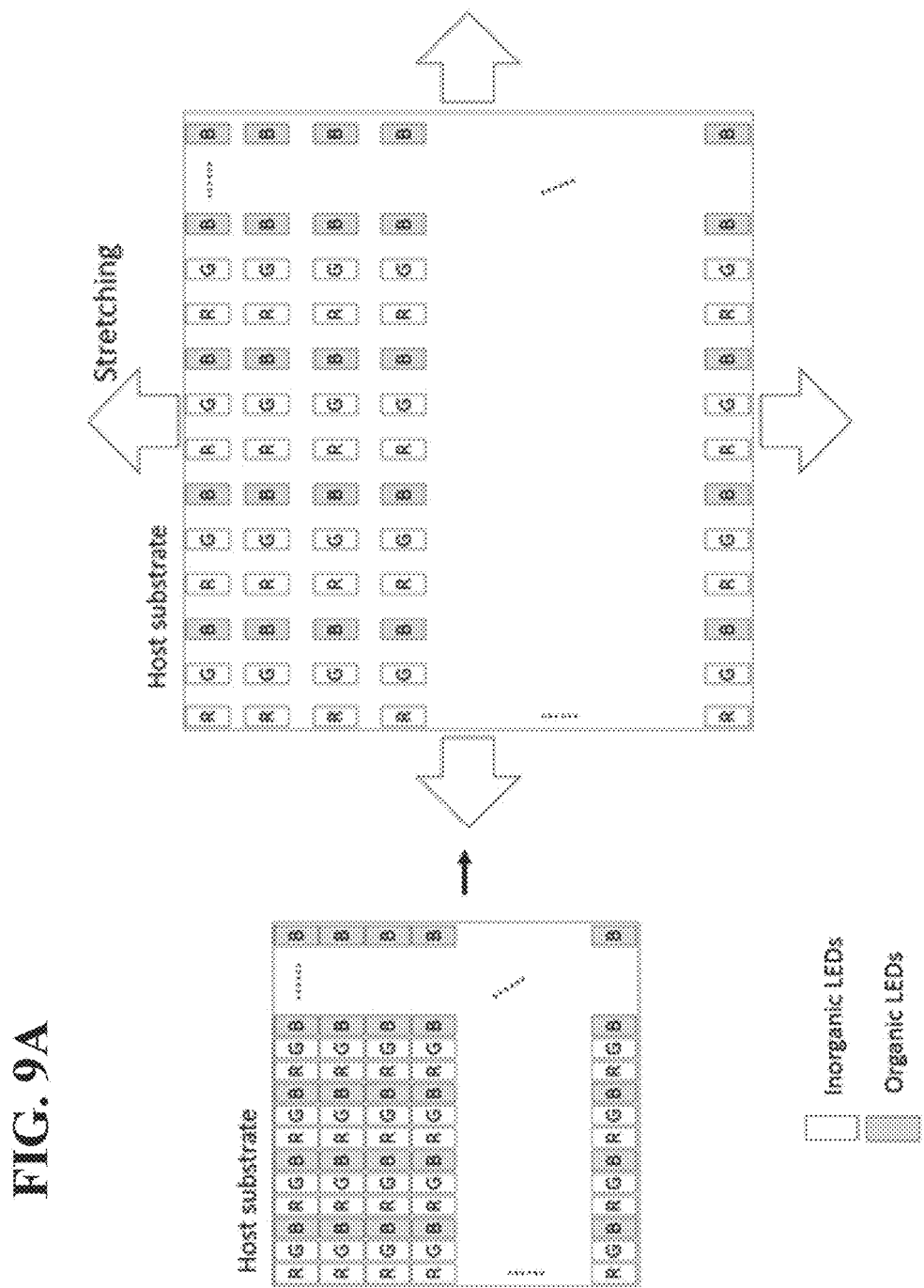

FIGS. 9A and 9B show examples of scaling an organic and/or inorganic LED-based display by expanding a stretchable substrate and electrode. Initially, an elastomeric host substrate may include inorganic LEDs and/or OLEDs as previously described. The host substrate may include inorganic LEDs fabricated and transferred according to the techniques disclosed herein, such as the ND-ELO process. As described with respect to FIGS. 5-7, any combination of organic and inorganic LEDs, color altering layers, color arrangements, and relative active areas sizes may be used. Once the active areas are transferred and/or fabricated on the elastomeric host substrate, the host substrate may be deformed to increase the size of the display and the separation between adjacent active areas. For example, the host substrate may be stretched uniformly in each direction as shown in FIGS. 9A-9B. The substrate may be deformed, for example, by applying pressure to the host substrate with a curved surface such as a rigid roll, a pin, a spherical surface, a vacuum mold, or the like. The deformed substrate may increase the separation between adjacent active areas by a small amount, or by a relatively large amount. In some embodiments, the separation between adjacent active areas may be increased by up to 4-10 times. Such techniques also may be used to arrange the host substrate in a curved display, such as by applying a vacuum mold to obtain a desired conformal shape of the host substrate. Techniques such as shown in FIGS. 9A and 9B may be useful, for example, to achieve a desired display size that is larger than an available wafer or other parent substrate size, without using a multi-wafer arrangement as shown and described with respect to FIG. 8.

As used herein, a "red" layer, material, or device refers to one that emits light in the range of about 580-700 nm; a "green" layer, material, or device refers to one that has an emission spectrum with a peak wavelength in the range of about 500-600 nm; a "blue" layer, material, or device refers to one that has an emission spectrum with a peak wavelength in the range of about 400-500 nm. Similarly, a color altering layer refers to a layer that converts or modifies another color of light to light having a wavelength as specified for that color. For example, a "red" color filter refers to a filter that results in light having a wavelength in the range of about 580-700 nm.

Experimental

Epitaxial layer structures were grown by gas-source molecular beam epitaxy (GSMBE) on Zn-doped (100) p-GaAs substrates. For the protection layer, the growth starts with GaAs (0.1μm)/In$_{0.49}$Ga$_{0.51}$P (0.05μm)/GaAs (0.1 μm) layers followed by a 20 nm thick AlAs sacrificial layer. Next, an inverted active LEDs region is grown as follows: a 0.1 μm thick, 5×10$^{18}$ cm$^{-3}$ Be-doped GaAs contact layer, 0.8 μm thick, 2×10$^{18}$ cm$^{-3}$ Be-doped Al$_{0.20}$In$_{0.49}$Ga$_{0.31}$P layer, 0.1 μm thick un-doped In$_{0.49}$Ga$_{0.51}$P layer, 0.8 μm thick, 2×10$^{18}$ cm$^{-3}$ Si-doped Al$_{0.20}$In$_{0.49}$Ga$_{0.31}$P layer, 0.1 μm thick, 5×10$^{18}$ cm$^{-3}$ Si-doped n-GaAs contact layer (FIG. 9(a)). GaAs/AlAs layers are grown at 600° C. and Al$_{0.20}$In$_{0.49}$Ga$_{0.31}$P/In$_{0.49}$Ga$_{0.51}$P layers are grown at 480° C.

Two freshly deposited 350 nm thick Au films on opposing surfaces are bonded together with the application of pressure. Thus, the GaAs wafer with epitaxial layer is bonded to the Kapton® sheet using an EVG 520 wafer bonder under ~10$^{-5}$ torr vacuum immediately following Au deposition by e-beam evaporation. For a 2 inch-diameter substrate, 4 MPa of pressure is applied to establish a bond between the two gold films with a 80 N/sec ramping rate. Then the thermally assisted cold-weld bonding process is carried out by ramping the temperature at 25° C./min to 175° C., and holding at the peak temperature for 3 min. The substrate temperature is subsequently reduced using active stage cooling. To apply a uniform force over the sample area, a reusable, soft graphite sheet is inserted between the sample and the press head. Once the GaAs substrate is bonded to the Kapton® sheet, the thin active device region is removed from its parent substrate through the non-destructive epitaxial lift-off (ND-ELO) process. The entire sample is immersed in a 20% HF solution maintained at 60 C. The HF solution is agitated with a stir bar at 400 rpm. Due to the high etch selectivity between AlAs and the active compound semiconductor layers, dilute HF removes the 20 nm thick AlAs sacrificial layer between the wafer and active device region without attacking the adjacent protection layers. The total lift-off time for a 2 inch GaAs substrate is approximately 5 hours.

After the ND-ELO process, the thin-film active region and flexible plastic secondary substrate is fixed to a rigid substrate as in the case of the solar cell processing. The front finger grid is patterned by photolithography as in the case of the solar cells. Then, a Pd (5 nm)/Zn (20 nm)/Pd (15 nm)/Au (300 nm) metal contact is deposited by e-beam evaporation. The width of front grid is 25 μm, and a 300 μm×300 μm contact pad is patterned at the center of the grid. The total coverage of front contact is 22.7%. After the metal layer is lifted off, 680 μm×680 μm mesas are defined by photolithography using S-1827 (Microchem) and chemical etching using the same etchants as for the solar cells. The thin-film LEDs are annealed for 1 hr at 200° C. for ohmic contact formation.

Multiple cycles of AlGaInP/InGaP double heterojunction LEDs were grown and fabricated to test the generality of the process approach. FIG. 10B shows images of the thin film LEDs with and without current injection (bent over a 1.2 cm radius without incurring damage or performance degradation), confirming device flexibility as in the case of the solar cells in FIG. 3. The J-V and EQE characteristics of the first and second ELO-processed thin-film LEDs are compared in FIGS. 10C and 10D, respectively. Turn-on voltage (1.66±0.01 V and 1.67±0.01 V, respectively) and peak EQE (4% variation) are extracted from the data for the first and second ELO cycles. Electroluminescence (EL) spectra for these same devices is provided in 10E. The nearly identical performances of the first and second ELO processed thin film LEDs is confirmed by the measured full width half maxima of 16.5 nm and 16.6 nm, and peak EL intensities (3% variation) at an injection current of 60 mA.

To demonstrate the effectiveness of wafer recycling using the above methods, the cleaned parent wafer was re-loaded into the GSMBE chamber for subsequent growth, and the same procedure was repeated multiple times with AlGaInP/GaInP double heterostructure red LEDs fabricated after each growth/ELO/cleaning cycle to ensure that no degradation of the original wafers was carried into the next cycle. This method can be applied to most III-V epitaxy lattice-matched or strained epitaxial layers with GaAs. AlGaAs or AlGaInP based red LEDs and AlGaInP or AlGaP based green LEDs can be fabricated using the same method as a red/green pixel for display technology. In addition, infrared (GaAs or AlGaAs), Orange (AlGaInP) and yellow (AlGaInP) LEDs also can be made with the same technology.

Figure 10A:
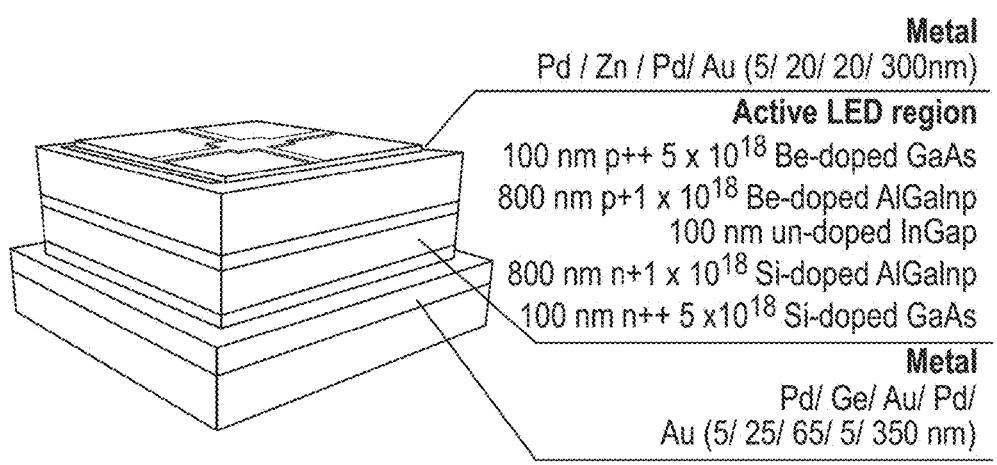
FIG. 10A shows an example of a thin-film heterostructure LED as disclosed herein.
Figure 10B:
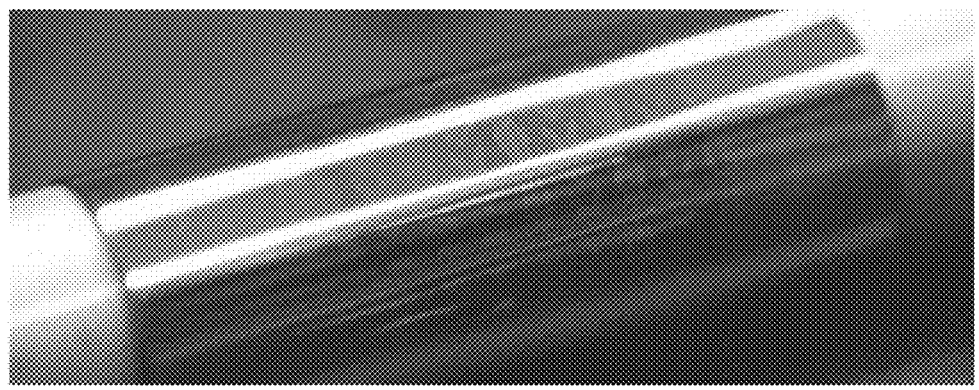
FIG. 10B shows images of patterned LEDs bonded by thermally assisted cold-welding (top), and the same device under operation (bottom) as disclosed herein.
Figure 10B:
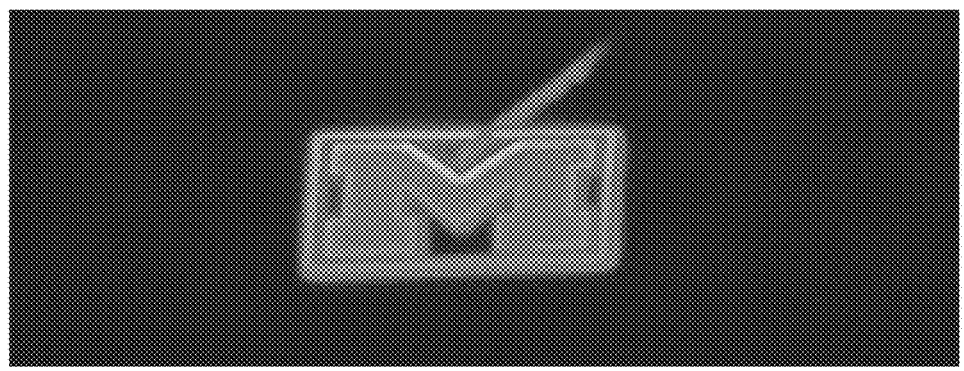

FIG. 10A shows an example of the thin-film AlGaInP/InGaP double heterostructure LEDs. FIG. 10B shows images of patterned LEDs in the shape of the University of Michigan logo bonded by thermally assisted cold-welding to a Kapton™ substrate (top), and the same device under operation (bottom). The images were taken for the plastic wrapped around a 1.2 cm radius cylinder.

Figure 10C:
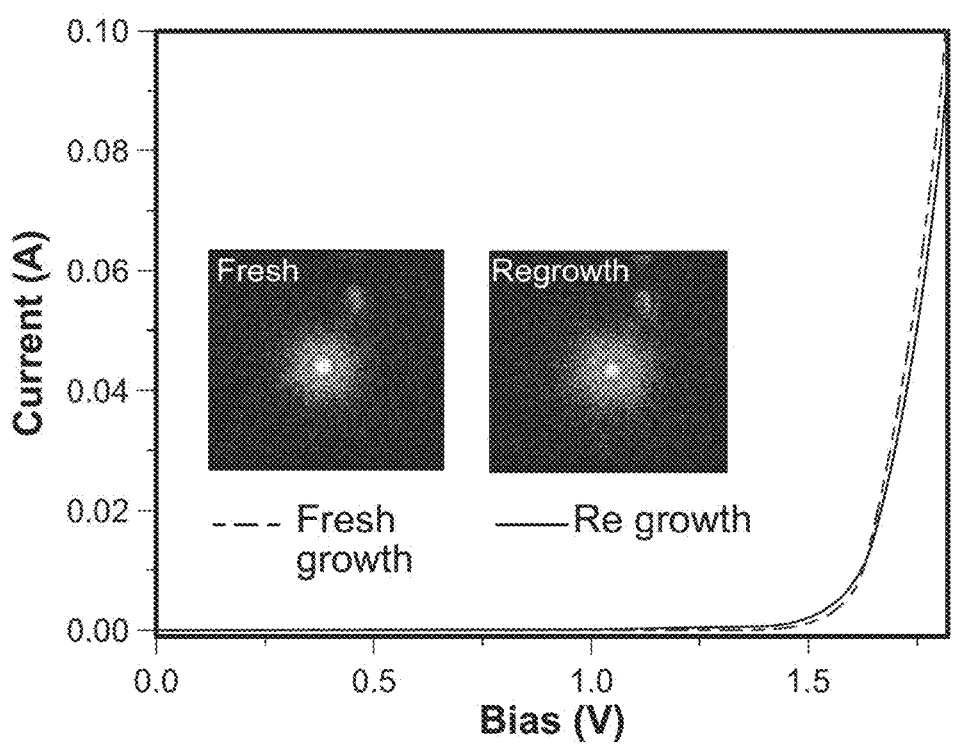
FIG. 10C shows the current density versus voltage (J-V) characteristics of an example device as disclosed herein
Figure 10D:
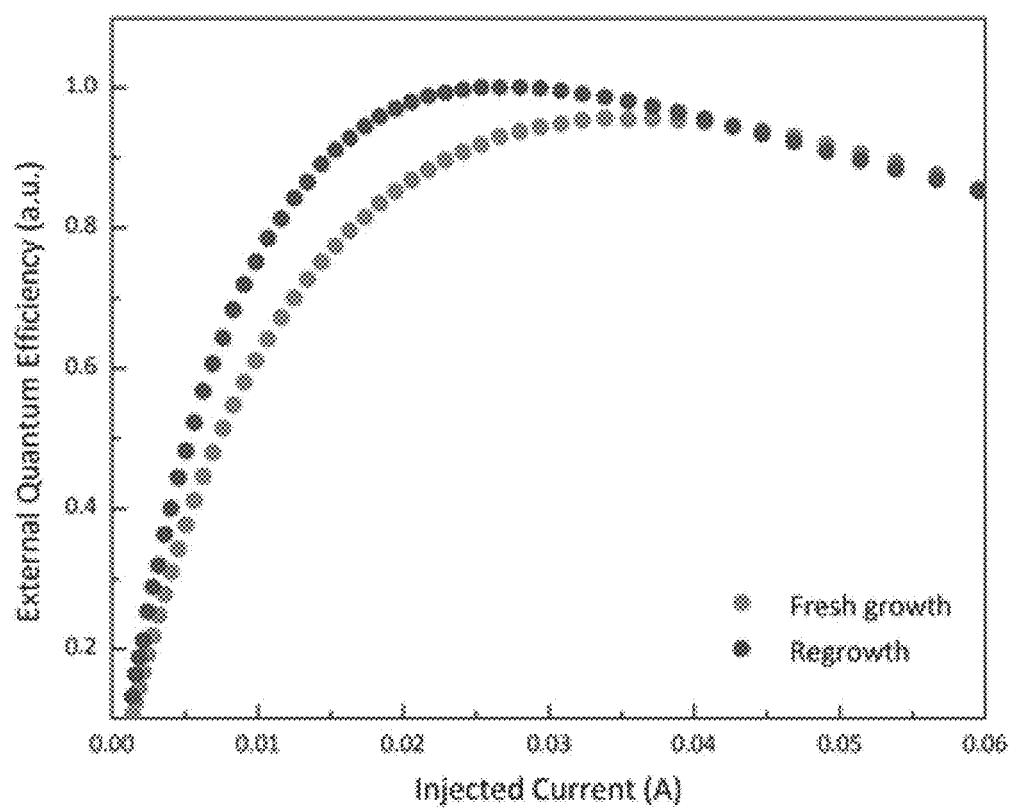
FIG. 10D shows the external quantum efficiency (EQE) measured from 400 nm to 900 nm for a device as disclosed herein.
Figure 10E:
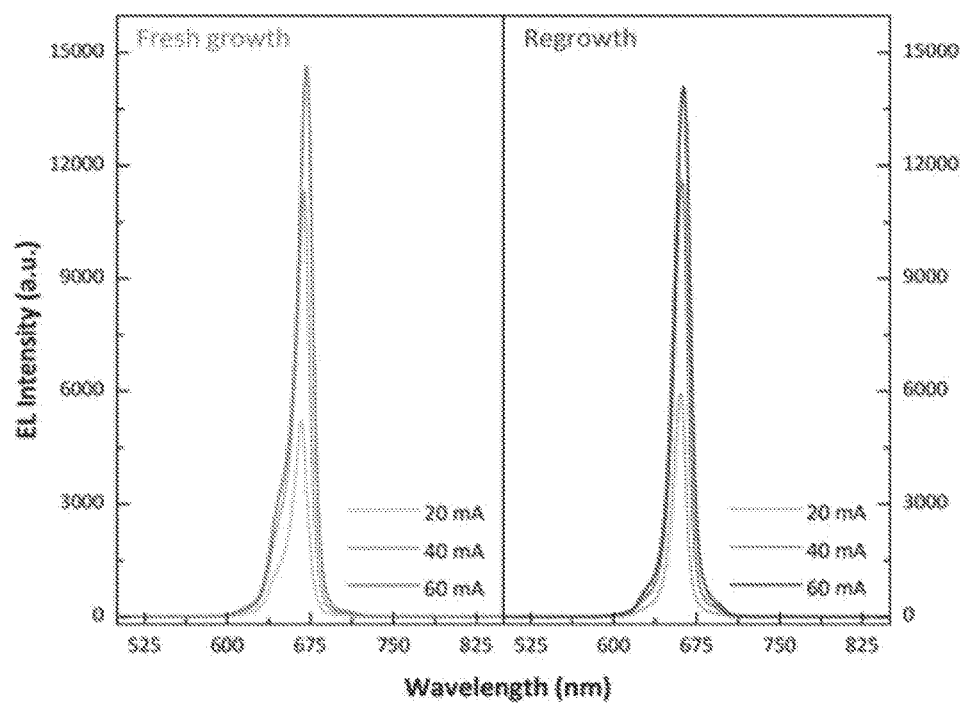
FIG. 10E shows a comparison of electroluminescence (EL) spectrum intensity for LEDs after the first and second ND-ELO removal from the same parent wafer for a device as disclosed herein.

FIG. 10C shows the current density versus voltage (J-V) characteristics of the example device, and FIG. 10D shows the external quantum efficiency (EQE) measured from 400 nm to 900 nm. FIG. 10E shows a comparison of electroluminescence (EL) spectrum intensity for LEDs after the first and second ND-ELO removal from the same parent wafer. Similar peak EL intensities and full width half maxima (FWHM) indicate identical device performance without systematic degradation from the wafer recycling process.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. A hybrid LED/OLED device that includes a first plurality of pixels, wherein each pixel of the first plurality of pixels comprises:
   an inorganic first light-emitting diode (LED) disposed over a substrate, the inorganic first LED configured to emit blue light;

an organic second LED (OLED) disposed over the substrate and adjacent to the first inorganic LED, the organic second OLED configured to emit green light; and an organic third LED (OLED) disposed over the substrate and adjacent to the first LED or the second LED, the organic third OLED configured to emit red light;

wherein each of the first, second, and third LEDs is individually addressable as a sub-pixel within the each pixel of the first plurality of pixels.

2. The device of claim 1, wherein the device is a full-color flat panel display device selected from the group consisting of:

a computer monitor, a medical monitor, a television, a billboard, a heads-up display, a fully or partially transparent display, a flexible display, a cell phone, a tablet, a phablet, a personal digital assistant (PDA), a laptop computer, a digital camera, a camcorder, a viewfinder, a micro-display, a 3-D display, a vehicle, a large area wall, theater or stadium screen, and a sign.

3. The device of claim 1, wherein the substrate is an elastomeric substrate.

4. The device of claim 1, wherein the substrate is an elastomeric substrate.

5. The device of claim 1, wherein each pixel of the first plurality of pixels is integrated with a backplane circuit to individually control the first inorganic LED, the second OLED, and the third OLED.

6. A method comprising:

providing a substrate and depositing an epitaxial sacrificial layer over the substrate;

depositing a plurality of emissive stacks over the epitaxial sacrificial layer;

applying one or more layers to each stack of the plurality of emissive stacks to form a first plurality of LEDs, the first plurality of LEDs configured to emit blue;

depositing a metal layer on the first plurality of LEDs;

providing a host substrate with a patterned metal layer, and a plurality of organic second LED (OLED) adjacent to the patterned metal layer;

transferring a first portion of the first plurality of LEDs to the host substrate, wherein the patterned metal layer of the host substrate is aligned with the metal layer on the first plurality of LEDs;

cold welding the first plurality of LEDs to the patterned metal layer of the host substrate; and separating the epitaxial sacrificial layer from the emissive stack to provide an arrangement of the first plurality of LEDs and the second organic OLED as sub-pixels adjacent to one another.

7. The method of claim 6, wherein the second plurality of LEDs comprises OLEDs configured to emit red or green light.

8. The method of claim 6, further comprising fabricating color altering layers over the first plurality of LEDs.

9. The method of claim 6, wherein the substrate comprises a material selected from the group consisting of: GaN, sapphire, GaAs, Si, InP, and GaSb.

10. The method of claim 6, further comprising:

transferring a second portion of the first plurality of LEDs to the host substrate.

11. The method of claim 6, wherein the substrate is an elastomeric substrate.

12. The method of claim 11, further comprising deforming of the host substrate by stretching the host substrate across a curved surface or a spherical surface.

13. The method of claim 12, further comprising deforming the host substrate by placing the host substrate in a vacuum mold and applying a vacuum.

14. The method of claim 6, further comprising depositing an epitaxial protective layer over the substrate, and prior to depositing the epitaxial sacrificial layer.

15. The method of claim 6, further comprising aligning a backplane circuit to control the first and the second plurality of LED (OLED).

16. A method comprising:

depositing a plurality of inorganic LEDs on an elastomeric substrate;

deforming the elastomeric substrate to increase the distance between adjacent inorganic LEDs of the plurality of inorganic LEDs on the elastomeric substrate; and subsequent to the deforming, fabricating a plurality of OLEDs on the elastomeric substrate.

* * * * *

UNITED STATES PATENT AND TRADEMARK OFFICE
CERTIFICATE OF CORRECTION

PATENT NO. : 10,229,958 B2
APPLICATION NO. : 16/112960
DATED : March 12, 2019
INVENTOR(S) : Stephen R. Forrest et al.

Page 1 of 1

It is certified that error appears in the above-identified patent and that said Letters Patent is hereby corrected as shown below:

In the Specification

The Statement Regarding Government Rights paragraph, Column 1, Lines 8-14: The claimed invention was made under Contract No. DE-SC0001013, awarded by the U.S. Department of Energy (DOE), Office of Basic Energy Sciences, as part of the Center for Energy Nanoscience, Energy Frontier Research Center. The govermnent may have certain rights in the invention. should read --This invention was made with government support under DE-SC0001013 awarded by the U.S. Department of Energy. The government has certain rights in the invention.--

Signed and Sealed this
Twenty-third Day of April, 2019

Andrei Iancu
*Director of the United States Patent and Trademark Office*